US010513431B2

(12) United States Patent
Wen et al.

(10) Patent No.: US 10,513,431 B2
(45) Date of Patent: Dec. 24, 2019

(54) MULTIPLE SILICON TRENCHES FORMING METHOD FOR MEMS SEALING CAP WAFER AND ETCHING MASK STRUCTURE THEREOF

(71) Applicant: HANGZHOU SILAN INTEGRATED CIRCUIT CO., LTD, Hangzhou (Xiasha) (CN)

(72) Inventors: Yongxiang Wen, Hangzhou (CN); Chen Liu, Hangzhou (CN); Feng Ji, Hangzhou (CN); Liwen Li, Hangzhou (CN)

(73) Assignee: HANGZHOU SILAN INTEGRATED CIRCUIT CO., LTD, Hangzhou (Xiasha) (CN)

( * ) Notice: Subject to any disclaimer, the term of this patent is extended or adjusted under 35 U.S.C. 154(b) by 0 days.

(21) Appl. No.: 16/109,045

(22) Filed: Aug. 22, 2018

(65) Prior Publication Data

US 2018/0362339 A1 Dec. 20, 2018

Related U.S. Application Data

(62) Division of application No. 14/389,565, filed as application No. PCT/CN2013/072799 on Mar. 18, 2013, now Pat. No. 10,081,541.

(30) Foreign Application Priority Data

Apr. 1, 2012 (CN) .......................... 2012 1 0096370

(51) Int. Cl.
*H02N 1/00* (2006.01)
*B81C 1/00* (2006.01)
*B81B 7/00* (2006.01)

(52) U.S. Cl.
CPC ........ *B81C 1/00619* (2013.01); *B81B 7/0077* (2013.01); *B81C 1/00396* (2013.01); *H02N 1/008* (2013.01); *B81B 2203/033* (2013.01)

(58) Field of Classification Search
CPC ..................................................... H02N 1/008
See application file for complete search history.

(56) References Cited

U.S. PATENT DOCUMENTS 4,172,005 A 10/1979 Muraoka et al.
6,383,921 B1 5/2002 Chan et al.
(Continued)

FOREIGN PATENT DOCUMENTS

CN 102067289 A 5/2011
CN 102328899 A 1/2012

*Primary Examiner* — Lex H Malsawma
*Assistant Examiner* — Geoffrey H Ida
(74) *Attorney, Agent, or Firm* — Birch, Stewart, Kolasch & Birch, LLP

(57) ABSTRACT

A multiple silicon trenches forming method and an etching mask structure, the method comprises: step S11, providing a MEMS sealing cap silicon substrate (100); step S12, forming n stacked mask layers (101, 102, 103) on the MEMS sealing cap silicon substrate (100), after forming each mask layer, photolithographing and etching the mask layer and all other mask layers beneath the same to form a plurality of etching windows (D1, D2, D3); step S13, etching the MEMS sealing cap silicon substrate by using the current uppermost mask layer and a layer of mask material beneath the same as a mask; step S14, removing the current uppermost mask layer; step S15, repeating the step S13 and the step S14 until all the n mask layers are removed. The present invention can form a plurality of deep trenches with high aspect ratio on the MEMS sealing cap silicon substrate using conventional semiconductor processes, avoiding the problem that the conventional spin coating cannot be conducted on a sealing cap wafer with deep trenches using photoresist.

15 Claims, 8 Drawing Sheets

(56) References Cited

U.S. PATENT DOCUMENTS

| | | |
|---|---|---|
| 2004/0232110 A1 | 11/2004 | Hsieh et al. |
| 2011/0089141 A1 | 4/2011 | Tanaka et al. |
| 2011/0159689 A1 | 6/2011 | Kim |
| 2013/0100424 A1 | 4/2013 | Sabry et al. |

MULTIPLE SILICON TRENCHES FORMING METHOD FOR MEMS SEALING CAP WAFER AND ETCHING MASK STRUCTURE THEREOF

CROSS-REFERENCE TO RELATED APPLICATIONS

This application is a Divisional of copending application Ser. No. 14/389,565, filed on Sep. 30, 2014, which is the National Phase under 35 U.S.C. § 371 of International Application No. PCT/CN2013/072799, filed on Mar. 18, 2013, which claims the benefit under 35 U.S.C. § 119(a) to Patent Application No. 201210096370.0, filed in China on Apr. 1, 2012, all of which are hereby expressly incorporated by reference into the present application.

TECHNICAL FIELD

The present invention relates to a method for forming multiple silicon trenches for MEMS sealing cap wafer and etching mask structure thereof, more particularly, to a method for forming multiple silicon trenches with different depths on MEMS sealing cap wafer.

BACKGROUND

MEMS (Micro Electro Mechanical Systems) which develops since 1960s is known as a revolutionary high-tech in the 21st century. MEMS is a skillful combination of the microelectronic technology and the micro-mechanical technologies, and MEMS is a new multidisciplinary technology developed in recent years that has a revolutionary impact on the future human life.

The fundamental technologies of MEMS include silicon anisotropic etching technology, silicon/silicon bonding technology, surface micro-machining technology, LIGA technology and the like, and these technologies have become essential core technologies for the research and production of MEMS. In silicon-based MEMS processing technology, the most critical processes mainly include anisotropic etching technique of high aspect ratio, bonding technology and surface sacrificial layer technology and the like. The anisotropic etching technology is the key technology of bulk silicon micro-machining, and dry plasma etching technology has become a mainstream of micro-machining technology. With the development of integrated circuit technology, dry etching of silicon trenches with high aspect ratios is no longer a difficult problem. For example, silicon trenches with desired relatively high aspect ratios can be obtained by using inductively coupled plasma, high density plasma etching equipment, etc. However, when the aspect ratios of the silicon trenches are greater than 2 or the depths of the silicon trenches are greater than 3 µm, the deep trenches previously formed will result in the photoresist subsequently formed being trapped in the deep trenches, making it impossible to use conventional spin coating process to obtain a photoresist plane with uniform thickness on a silicon wafer, thereby subsequent photolithographic process can not function normally. As to a sealing cap wafer for bonding of MEMS, it generally has trenches with many more different depths and widths, the depths of the trenches are up to tens or even hundreds of micrometers (µm), therefore the above phenomenon is more serious. Therefore, there is a need to provide a new method for forming silicon trenches with different depths on MEMS sealing cap silicon substrate.

SUMMARY

The technical problem to be solved by the present invention is to provide a multiple silicon trenches forming method for MEMS sealing cap wafer and etching mask structure thereof, which is capable of forming a plurality of silicon trenches with different depths on MEMS sealing cap wafer. The method is simple to operate, and has high industrial applicability.

To solve the above problems, the present invention provides a multiple silicon trenches forming method for MEMS sealing cap wafer, comprising:

Step S11, providing a MEMS sealing cap silicon substrate;

Step S12, forming n stacked mask layers on the MEMS sealing cap silicon substrate, after forming each mask layer, photolithographing and etching the mask layer and all other mask layers beneath the mask layer to form multiple etching windows, wherein n is a positive integer greater than or equal to 2, and any two adjacent mask layers are made of different materials;

step S13, etching the MEMS sealing cap silicon substrate by using a current uppermost mask layer in the n mask layers as a mask, with an etching selectivity ratio of the MEMS sealing cap silicon substrate to the current uppermost mask layer greater than or equal to 10:1;

step S14, removing the current uppermost mask layer;

step S15, repeating the step S13 and the step S14 until all the n mask layers are removed.

Alternatively, in the step S13, the etching selectivity ratio of the MEMS sealing cap silicon substrate to the current uppermost mask layer is between 10:1 to 100:1.

Alternatively, the aspect ratios of the silicon trenches formed by etching are greater than 2 and depths of the silicon trenches are greater than 3 µm.

Alternatively, the number of the mask layers is 3, and the step S12 comprises:

forming a first mask layer on the MEMS sealing cap silicon substrate;

photolithographing and etching the first mask layer to form a first etching window in the first mask layer;

forming a second mask layer on the first mask layer;

photolithographing and etching the second mask layer and the first mask layer to form a second etching window in the second mask layer and the first mask layer;

forming a third mask layer on the second mask layer;

photolithographing and etching the third mask layer, the second mask layer and the first mask layer to form a third etching window in the third mask layer, the second mask layer and the first mask layer.

Alternatively, the step S13 to the step S15 comprise:

etching the MEMS sealing cap silicon substrate by using the third mask layer, the second mask layer and the first mask layer as a mask to form a first silicon trench with a depth of d3 in the MEMS sealing cap silicon substrate;

removing the third mask layer;

etching the MEMS sealing cap silicon substrate by using the second mask layer and the first mask layer as a mask to form a second silicon trench with a depth of d2 in the MEMS sealing cap silicon substrate, while the depth of the first silicon trench being deepened to d3+d2;

removing the second mask layer;

etching the MEMS sealing cap silicon substrate by using the first mask layer as a mask to form a third silicon trench with a depth of d1 in the MEMS sealing cap silicon substrate, while the depth of the first silicon trench being deepened to d3+d2+d1, and the depth of the second silicon trench being deepened to d2+d1;

removing the first mask layer.

Alternatively, d3 is 10 μm~100 μm, d2 is 10 μm~80 μm, and d1 is 10 μm~60 μm.

Alternatively, the first mask layer is a silicon oxide layer, the second mask layer is an aluminum layer or a silicon nitride layer, and the third layer is a photoresist mask layer.

Alternatively, the number of the mask layers is 2, the step S12 comprises:

forming a first mask layer on the MEMS sealing cap silicon substrate;

photolithographing and etching the first mask layer to form a first etching window in the first mask layer;

forming a second mask layer on the first mask layer;

photolithographing and etching the second mask layer and the first mask layer to form a second etching window in the second mask layer and the first mask layer.

Alternatively, the step S13 to the step S15 comprise:

etching the MEMS sealing cap silicon substrate by using the second mask layer and the first mask layer as a mask to form the first silicon trench with a depth of d2 in the MEMS sealing cap silicon substrate;

removing the second mask layer;

etching the MEMS sealing cap silicon substrate by using the first mask layer as a mask to form a second silicon trench with a depth of d1 in the MEMS sealing cap silicon substrate, while the depth of the first silicon trench being deepened to d2+d1;

removing the first mask layer.

Alternatively, d2 is 10 μm~100 μm, d1 is 10 μm~80 μm.

Alternatively, the first mask layer is a silicon oxide layer, and the second mask layer is a photoresist layer.

Alternatively, n is greater than or equal to 4, and the n mask layers comprises a plurality of first mask layers and second mask layers alternating with each other, wherein the first mask layers are silicon oxide layers, and the second mask layers are aluminum layers or silicon nitride layers.

The present invention also provides a multiple silicon trenches forming method for MEMS sealing cap wafer, the method comprises:

providing a MEMS sealing cap silicon substrate;

forming a silicon oxide layer on the MEMS sealing cap silicon substrate as a first mask layer;

photolithographing and etching the first mask layer to form a first etching window in the first mask layer;

forming an aluminum layer or a silicon nitride layer on the first mask layer as a second mask layer;

photolithographing and etching the second mask layer and the first mask layer to form a second etching window in the second mask layer and the first mask layer;

forming a photoresist layer on the second mask layer as a third mask layer;

photolithographing and etching the third mask layer, the second mask layer and the first mask layer to form a third etching window in the third mask layer, the second mask layer and the first mask layer;

etching the MEMS sealing cap silicon substrate by using the third mask layer, the second mask layer and the first mask layer as a mask to form a first silicon trench with a depth of d3 in the MEMS sealing cap silicon substrate;

removing the third mask layer;

etching the MEMS sealing cap silicon substrate by using the second mask layer and the first mask layer as a mask to form a second silicon trench with a depth of d2 in the MEMS sealing cap silicon substrate, while the depth of the first silicon trench being deepened to d3+d2;

removing the second mask layer;

etching the MEMS sealing cap silicon substrate by using the first mask layer as a mask to form a third silicon trench with a depth of d1 in the MEMS sealing cap silicon substrate, while the depth of the first silicon trench being deepened to d3+d2+d1 and the depth of the second silicon trench being deepened to d2+d1;

removing the first mask layer.

The present invention also provides a multiple silicon trenches etching mask structure for MEMS sealing cap wafer, the etching mask structure comprises:

a MEMS sealing cap silicon substrate;

n mask layers stacked successively on the MEMS sealing cap silicon substrate, wherein n is a positive integer greater than or equal to 2, and any two adjacent mask layers are made of different materials, with an etching selectivity ratio of the MEMS sealing cap silicon substrate to each mask layer greater than or equal to 10:1, an $i^{th}$ etching window being in an $i^{th}$ mask layer of the n mask layers, the $i^{th}$ etching window extending down through all other mask layers beneath the $i^{th}$ mask layer, wherein i is a positive integer greater than or equal to 1 and less than or equal to n.

Alternatively, the etching selectivity ratio of the MEMS sealing cap silicon substrate to each one of the n mask layers is between 10:1 and 100:1.

Alternatively, the number of the mask layers is 3, wherein the first mask layer is a silicon oxide layer, the second mask layer is an aluminum layer or a silicon nitride layer, and the third mask layer is a photoresist layer.

Alternatively, the number of the mask layers is 2, wherein the first mask layer is a silicon oxide layer, and the second mask layer is a photoresist layer.

Alternatively, n is greater than and equal to 4, and the n mask layers comprise a plurality of first mask layers and second mask layers alternating with each other, wherein the first mask layers are silicon oxide layers, and the second mask layer are aluminum layers or silicon nitride layers.

Compared with the prior art, the invention has the following advantages:

In the multiple silicon trenches forming method for MEMS sealing cap wafer and its etching mask structure of the present invention, the method includes: forming at least two stacked mask layers on MEMS sealing cap silicon substrate; after forming each mask layer, photolithographing and etching the mask layer and all other mask layers beneath the same to form a plurality of etching windows; then etching the MEMS sealing cap silicon substrate by using the current uppermost mask layer as a mask; removing the current uppermost mask layer after etching; then repeating the steps of etching the MEMS sealing cap silicon substrate and removing the uppermost mask layer until all the mask layers are removed, wherein when the MEMS sealing cap silicon substrate is etched, the etching selectivity ratio of the MEMS cap silicon substrate to the mask layer is greater than or equal to 10:1, preferably between 10:1 to 100:1. With the above method, since a plurality of mask layers are all formed prior to the silicon trenches on the MEMS sealing cap silicon substrate, the formation and distribution of the mask layers are not affected by the silicon trenches, avoiding the problem that the conventional spin coating cannot be conducted on a sealing cap wafer with deep trenches of high aspect ratio to coat photoresist in the prior art.

In addition, in the method for forming multiple silicon trenches for MEMS sealing cap wafer according to the embodiments of the present invention, the etching selectivity ratio of the MEMS sealing cap silicon substrate to the mask layer is quite large, therefore the mask layers are rarely etched during the process of forming silicon trenches by etching. In the case that the thicknesses of the mask layers are quite small (for example, less than 2 µm), the silicon trenches with the depths of tens to hundreds microns can be obtained, and the requirements of all kinds of products on the depths of the trenches can be satisfied.

Furthermore, the method for forming multiple silicon trenches for MEMS sealing cap wafer according to the embodiments of the present invention can form various different depths of the silicon trenches, for example, two kinds of depths, three kinds of depths, four or more kinds of depths.

DETAILED DESCRIPTION

The present invention is further described below in connection with specific embodiments and accompanying drawings, but the scope of protection of the present invention is not limited thereto.

Figure 1:
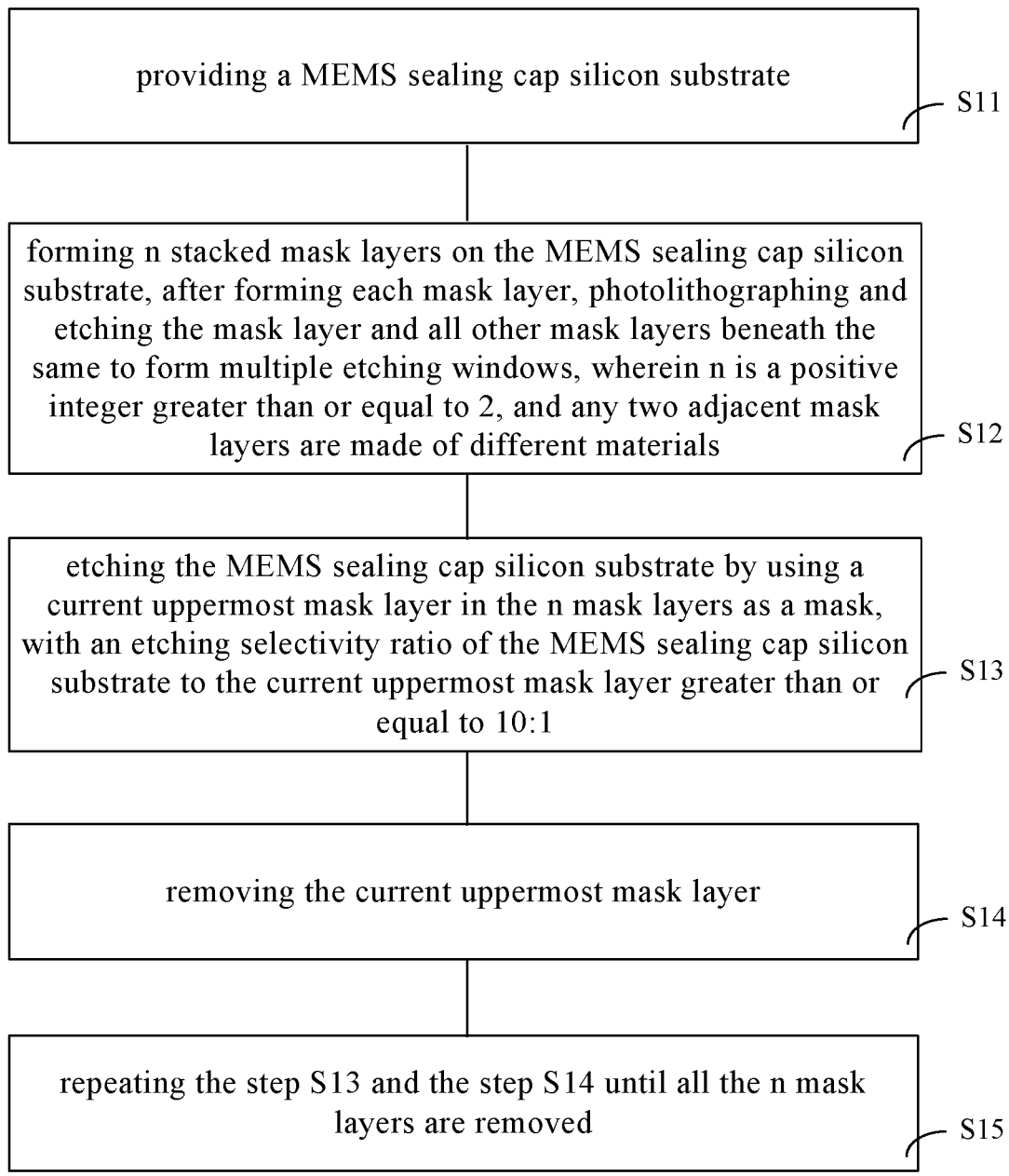
FIG. 1 is a schematic flow chart of a multiple silicon trenches forming method for MEMS sealing cap wafer according to the embodiments of the present invention.

FIG. 1 illustrates a schematic flow chart of a multiple silicon trenches forming method for MEMS cap wafer according to this embodiment of the present invention, the method includes:

step S11, providing a MEMS sealing cap silicon substrate;

step S12, forming n stacked mask layers on the MEMS sealing cap silicon substrate, after forming each layer, photo etching and etching on the mask layer and all other mask layers beneath the same to form multiple etching windows, wherein n is a positive integer greater than or equal to 2, and any two adjacent mask layers are made of different materials;

step S13, etching the MEMS sealing cap silicon substrate by using a current uppermost mask layer in the n mask layers as a mask, with an etching selectivity ratio of the MEMS sealing cap silicon substrate to the current uppermost mask layer greater than or equal to 10:1;

step S14, removing the current uppermost mask layer;

step S15, repeating the step S13 and the step S14 until all the n mask layers are removed;

Wherein, in the step S13, when the MEMS sealing cap silicon substrate is etched, the etching selectivity ratio of the MEMS sealing cap silicon substrate to the current uppermost mask layer is preferably between 10:1 to 100:1, and the aspect ratios of the silicon trenches formed in the MEMS sealing cap silicon substrate are greater than 2 and the depths of the silicon trenches are greater than 3 µm. Wherein the value of the etching selectivity ratios may be achieved by selecting materials of the mask layers and by adjusting the etching process parameters (for example, the type of etching gases).

The first embodiment is further described below in connection with FIGS. 2 to 9.

Figure 2:
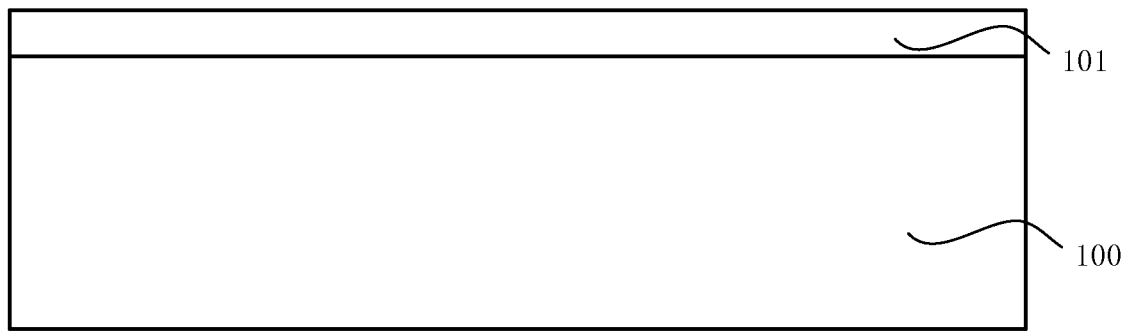
FIGS. 2 to 9 are cross-sectional schematic diagrams of structures in various steps of the multiple silicon trenches forming method for MEMS sealing cap wafer according to the first embodiment of the present invention.

Referring to FIG. 2, a MEMS sealing cap silicon substrate 100 is provided, and a silicon oxide layer 101 is formed on the MEMS sealing cap silicon substrate 100 as the first mask layer. Wherein the silicon oxide layer 101 may be formed by methods of thermal oxidation or chemical vapor deposition (CVD) and the like, and has a thickness of 4000 Å~8000 Å.

Figure 3:
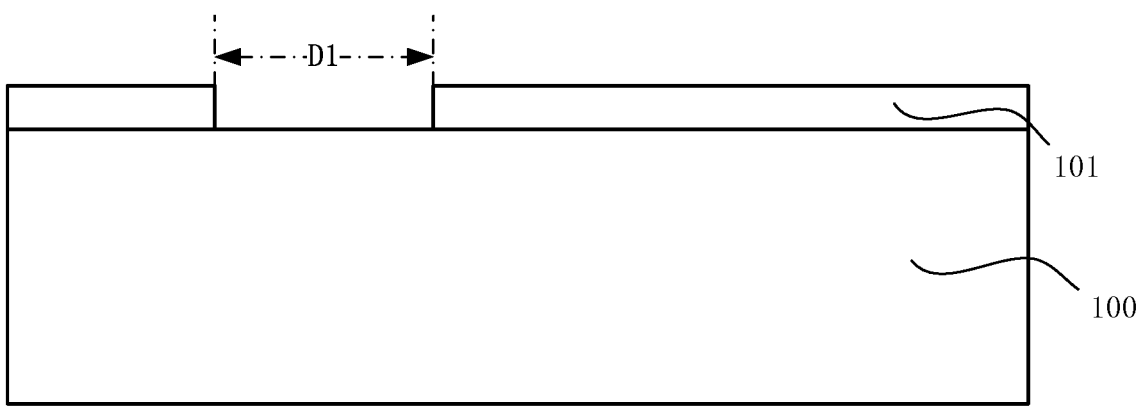

Then referring to FIG. 3, photolithographing and etching the silicon oxide layer 101, and the first etching window D1 is formed in the silicon oxide layer 101. Specifically, the etching equipment may be a Rainbow4500 of LAM corporation, and the etching gases may be CF4, CH3F, and Ar.

Figure 4:
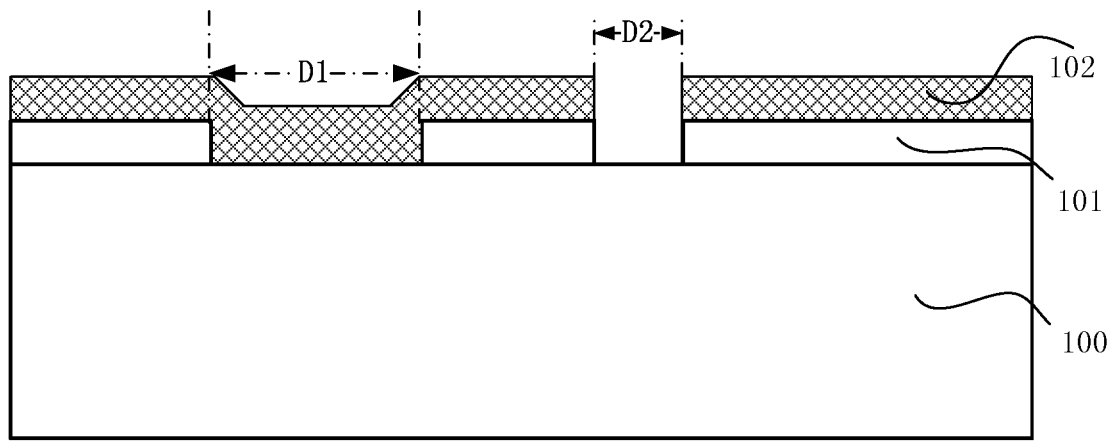

Then referring to FIG. 4, an aluminum layer 102 is formed on the silicon oxide layer 101 as the second mask layer. Photolithograph and etch the aluminum layer 102 and the silicon oxide layer 101 beneath the aluminum layer 102 to form the second etching window D2 in the aluminum layer 102 and the silicon oxide layer 101 beneath the aluminum layer 102. Specifically, the aluminum layer 102 may be formed by method of sputtering or evaporation, and the thickness of the aluminum layer 102 is 3000 Å~5000 Å. The aluminum layer 102 also fills in the first etching window D1 so that the first window D1 is protected by the covering of aluminum layer 102. The method for forming the second etching window D2 may include: firstly, dry etching the aluminum layer 102 using AM8330 metal etching machine from Applied Materials, Inc. with $Cl_2$, $BCl_3$, $CF_4$, $CHF_3$ and Ar gases to form the second etching window D2 in the aluminum layer 102; then, etching the silicon oxide layer 101 by Rainbow4500 equipment from LAM corporation so as to form the second etching window D2 in the aluminum layer 102 and the silicon oxide layer 101 beneath the aluminum layer 102. It should be noted that the second mask layer may also be a silicon nitride layer, which may be formed by chemical vapor deposition (CVD) and the like.

Figure 5:
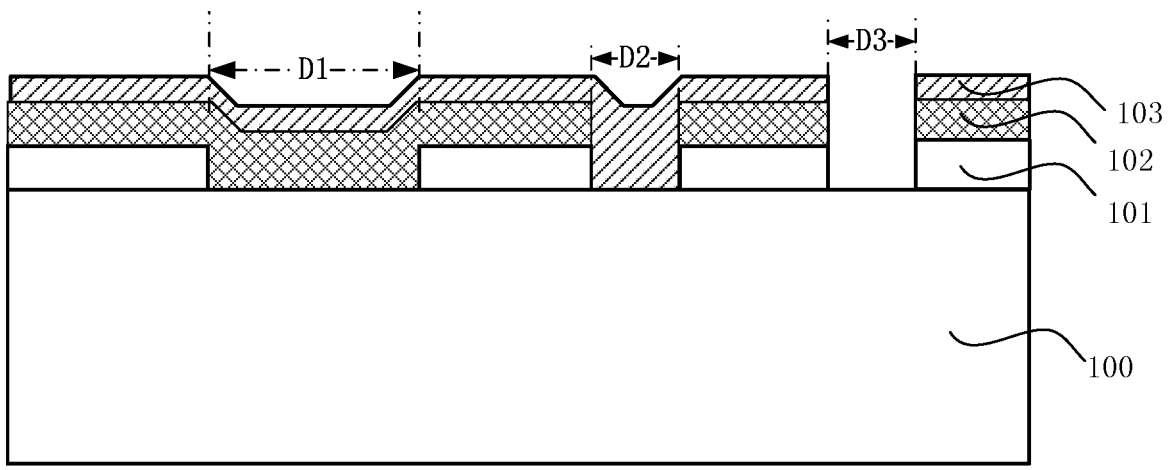

Referring to FIG. 5, a photoresist layer 103 is formed on the aluminum layer 102 as the third mask layer, and photolithographing and etching are performed on the photoresist layer 103 and the aluminum layer 102 and silicon oxide layer 101 beneath the photoresist layer 103, to form the third etching window D3 in the photoresist layer 103 and the aluminum layer 102 and silicon oxide layer 101 beneath the photoresist layer 103. Specifically, the photoresist layer 103 may be formed by conventional methods (for example, spin coating and the like) in microelectronic integrated circuit processes, with a thickness of about 2 µm, and the photoresist layer 103 formed also fills in the first etching window D1 and the second etching window D2; then the photoresist layer 103 is patterned and the aluminum layer 102 and the photoresist layer 103 is etched by photolithographing and etching processes, so as to form the third etching window D3 in the photoresist layer 103, the aluminum layer 102 and the silicon oxide layer 101. During the process of etching, the first etching window D1 and the second etching window D2 are protected by the photoresist layer 103.

Figure 6:
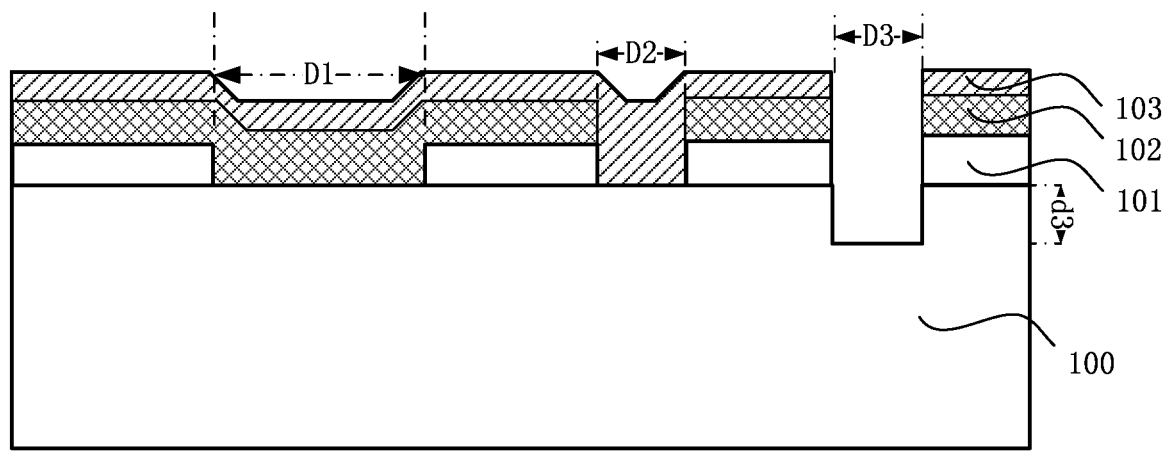

Then referring to FIG. 6, the MEMS cap silicon substrate 100 is etched by using the current uppermost photoresist layer 103 as the mask, i.e., using the third etching window D3 in the photoresist layer 103, the aluminum layer 102 and the silicon oxide layer 101 as the mask, to form the first silicon trench with a depth of d3. Specifically, the etching may be performed using AMS200 etching equipment from Alcatel corporation, and the etching gases are $SF_6$ and $C_4F_8$, wherein the etching process may be Bosch process known in the field of MEMS, i.e., a process in which the silicon etching and the passivation are performed alternately. The depth d3 of the first silicon trench may be set according to the requirements of products, in this embodiment, the depth d3 is 10 μm~100 μm. In addition, the etching selectivity ratio of the MEMS sealing cap silicon substrate 100 to the photoresist layer 103 is greater than 60:1, therefore the photoresist layer 103 is rarely etched during the process of etching. Thereby even though the thickness of the photoresist layer 103 is quite small (for example, less than 2 μm), the depth d3 of the first silicon trench formed may also go up to tens to hundreds microns.

After the first silicon trench is formed by etching, the photoresist layer 103 is removed, and the removal process may be completed by a dry process in an oxygen plasma atmosphere. After the removal of photoresist layer 103, the aluminum layer 102 becomes the current uppermost mask layer.

Figure 7:
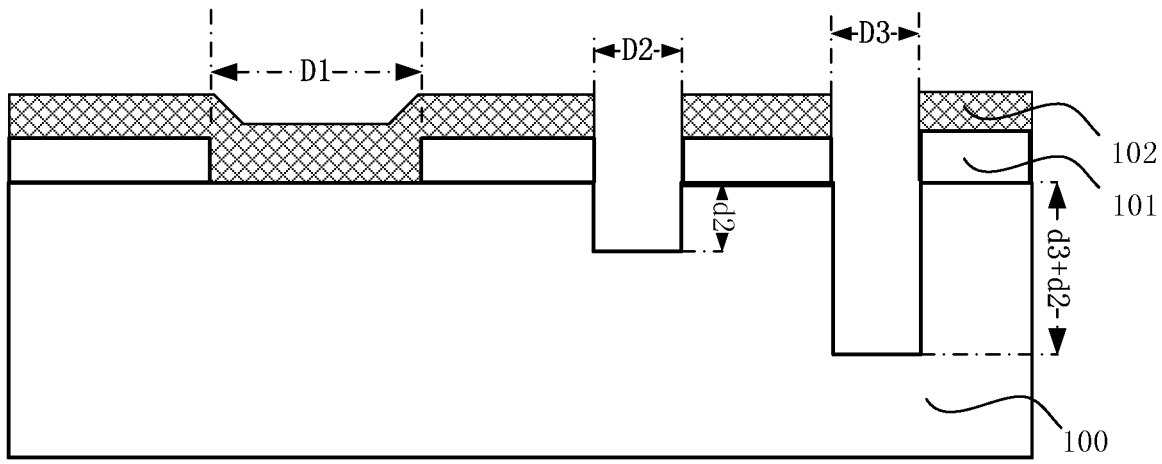

Referring to FIG. 7, the MEMS sealing cap silicon substrate 100 is etched by using the aluminum layer 102 as a mask, i.e., using the second etching window D2 in the aluminum layer 102 and the silicon oxide layer 101 as the mask, to form the second silicon trench with a depth of d2 in the MEMS sealing cap silicon substrate 100, while the depth of the first silicon trench is deepened to d3+d2. The depth d2 of the second silicon trench may be adjusted according to the requirements of products, while in this embodiment, the depth d2 is 10 μm~80 μm, and d3+d2 is 20 μm~180 μm. The etching selectivity ratio of the MEMS sealing cap silicon substrate 100 to the aluminum layer 102 is greater than 200:1, therefore the aluminum layer 102 is rarely etched during the process of etching. Thereby even though the thickness of the aluminum layer 102 is quite small (for example, less than 2 μm), the depth of the silicon trench formed may also go up to tens to hundreds microns.

After that, the aluminum layer 102 may be removed by a wet process commonly used in the microelectronics integrated circuit process, and the silicon oxide layer 101 is exposed as the uppermost mask layer.

Figure 8:
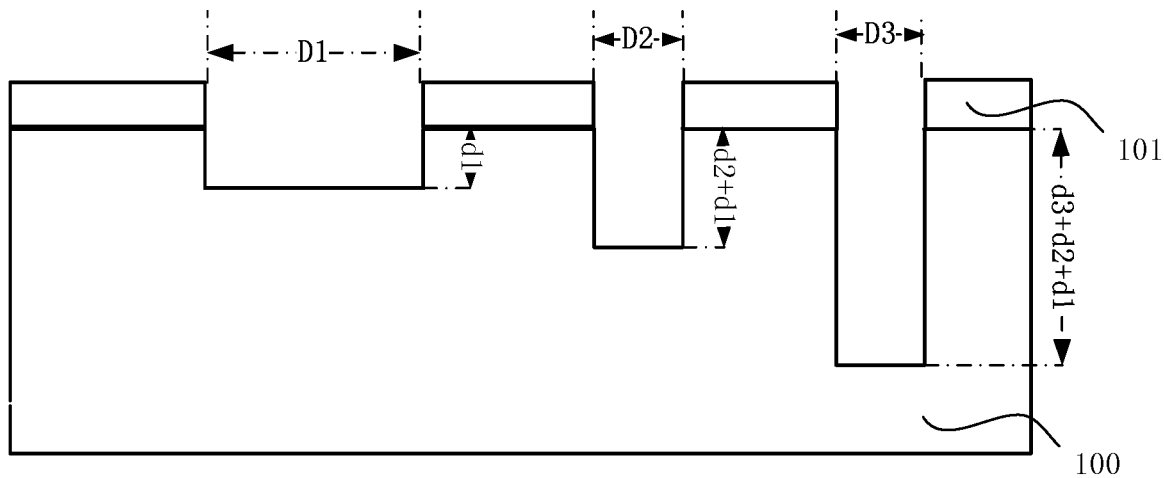

Referring to FIG. 8, the MEMS sealing cap silicon substrate 100 is etched by using the silicon oxide layer 101 as a mask, i.e., using the first etching window D1 in the silicon oxide layer 101 as the mask, to form the third silicon trench with a depth of d1 in the MEMS sealing cap silicon substrate 100, while the depth of the first silicon trench is deepened to d3+d2+d1 and the depth of the second silicon trench is deepened to d2+d1. The depth d1 of the third silicon trench may be adjusted according to the requirements of products, while in this embodiment, the depth d1 is 10 μm~60 μm, d2+d1 is 20 μm~180 μm and d3+d2+d1 is 30 μm~240 μm. The etching selectivity ratio of the MEMS sealing cap silicon substrate 100 to the silicon oxide layer 101 is greater than 200:1, therefore the silicon oxide layer 101 is rarely etched during the process of etching. Thereby even though the thickness of the silicon oxide layer 101 is quite small, the depth of the silicon trench formed may satisfy the requirements of design.

Figure 9:
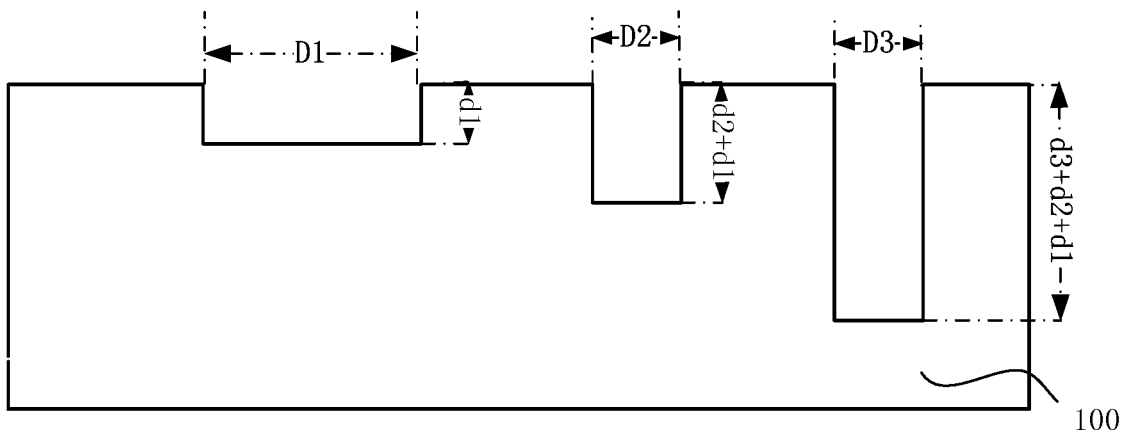

After that, the silicon oxide layer 101 may be removed by a wet etching using conventional HF acid or BOE etching solution, thereby the first silicon trench, the second silicon trench and the third silicon trench with different widths and depths required by the design of products are obtained. The specific structure thereof is shown in FIG. 9.

The second embodiment is described in detail below in connection with FIGS. 10 to 15.

Figure 10:
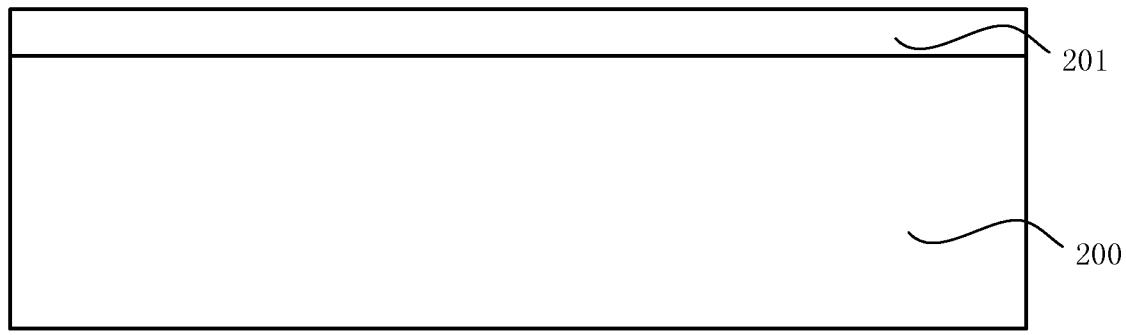
FIGS. 10 to 15 are cross-sectional schematic diagrams of structures in various steps of the multiple silicon trenches forming method for MEMS sealing cap wafer according to the second embodiment of the present invention.

Firstly, referring to FIG. 10, a MEMS sealing cap silicon substrate 200 is provided, and a silicon oxide layer 201 is formed on the MEMS sealing cap silicon substrate 200 as the first mask layer. Wherein the silicon oxide layer 201 may be formed by methods of thermal oxidation or chemical vapor deposition (CVD) and the like, and has a thickness of 4000 Å~8000 Å.

Figure 11:
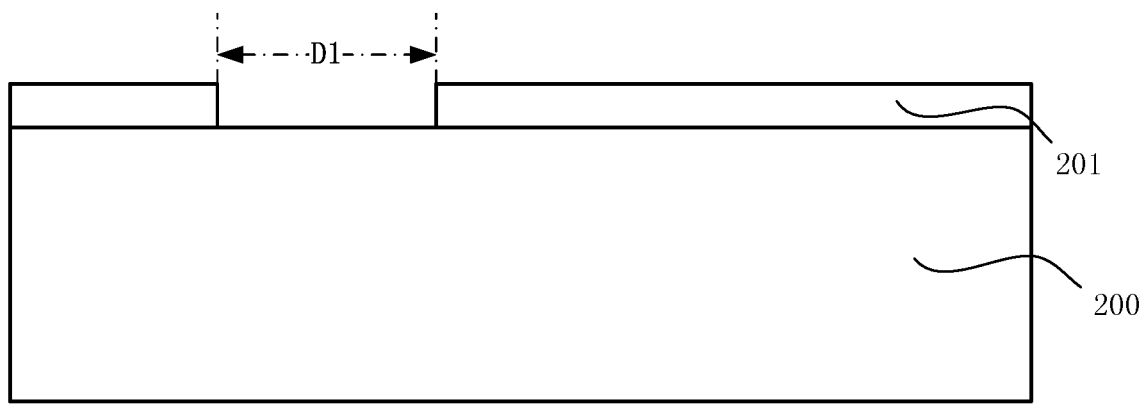

Then referring to FIG. 11, photoethch and etch the silicon oxide layer 201 to form the first etching window D1 in the silicon oxide layer 201. Specifically, the etching equipment may be Rainbow4500 from LAM corporation, and the etching gases may be CF4, CH3F and Ar.

Figure 12:
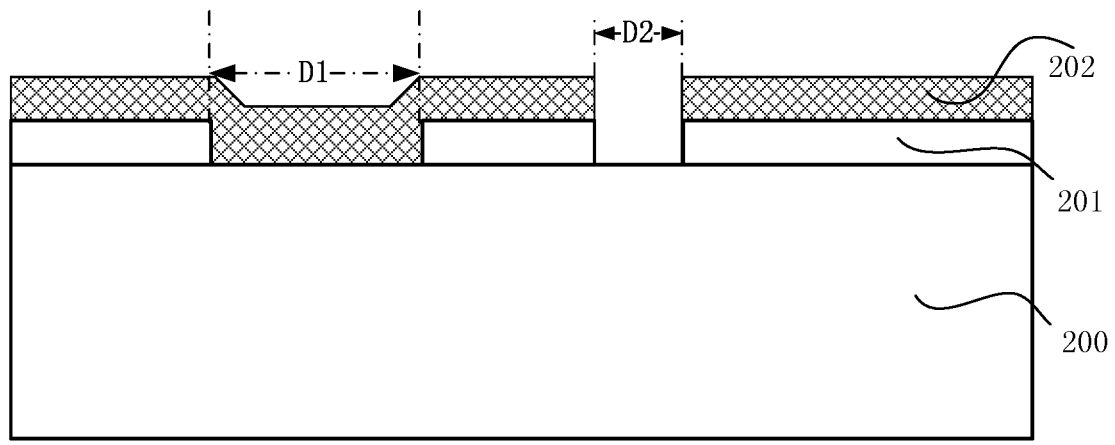

Referring to FIG. 12, an photoresist layer 202 is formed on the silicon oxide layer 201 as the second mask layer, photolithograph and etch the photoresist layer 202 and the silicon oxide layer 201 beneath the photoresist layer 202, to form the second etching window D2 in the photoresist layer 202 and the silicon oxide layer 201 beneath the photoresist layer 202. Wherein the thickness of the photoresist layer 202 may be 2 μm.

Figure 13:
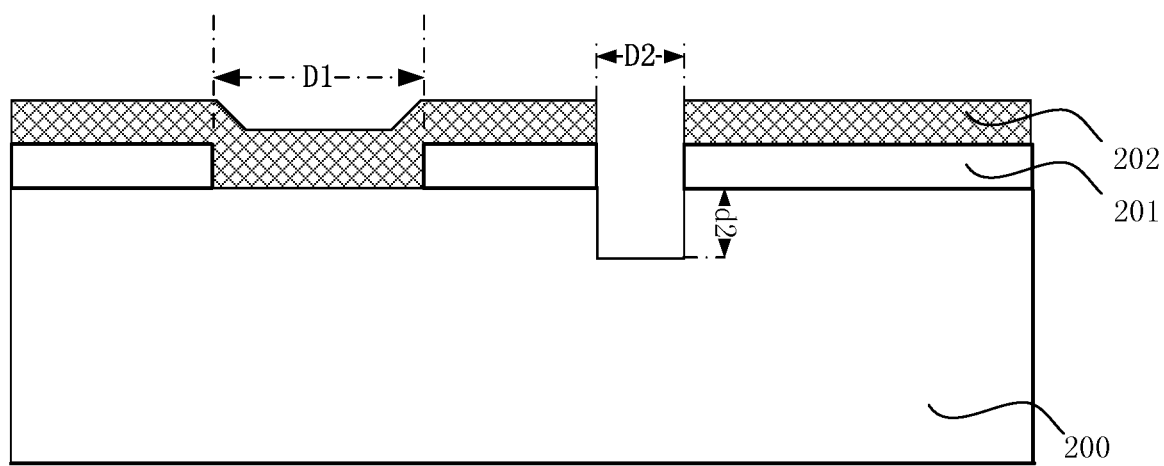

Referring to FIG. 13, the MEMS sealing cap silicon substrate 200 is etched by using the photoresist layer 202 as a mask to form the first silicon trench with a depth of d2 in the MEMS sealing cap silicon substrate 200. The etching equipment may be AMS200 from Alcate corporation, and the etching gases are $SF_6$ and $C_4F_8$. The etching process may be Bosch process known in the field of MEMS, i.e., a process in which etching and the passivation are performed alternately. The depth d2 may be 10 μm~100 μm.

After that, the photoresist layer 202 may be removed by a dry process in an oxygen plasma atmosphere to expose the silicon oxide layer 201.

Figure 14:
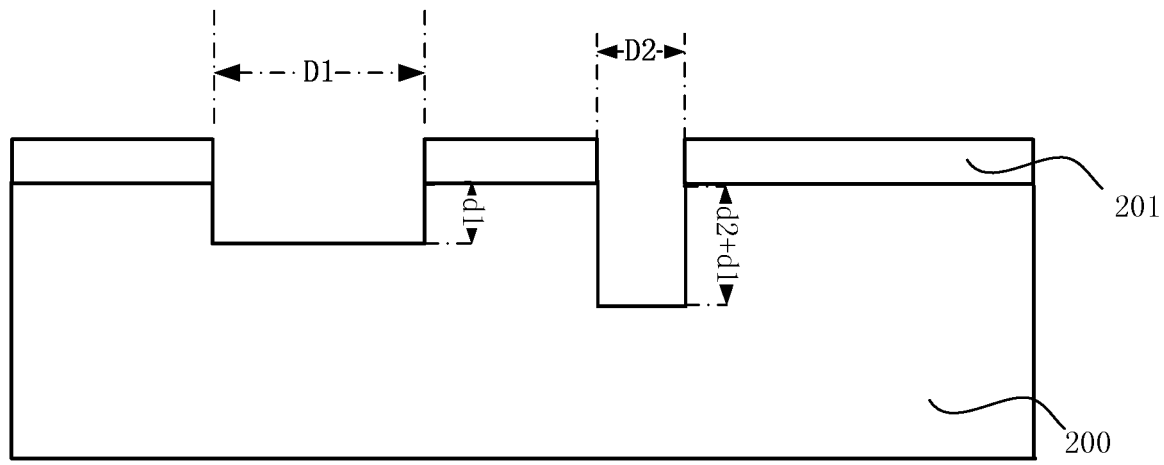

Referring to FIG. 14, the MEMS sealing cap silicon substrate 200 is etched by using the silicon oxide layer 201 as the mask to form the second silicon trench with a depth of d1 in the MEMS sealing cap silicon substrate 200, and the depth of the first silicon trench is deepened to d2+d1. The etching equipment may be AMS200 from Alcatel corporation, the depth d1 is 10 μm~80 μm, and d1+d2 is 20 μm~180 μm.

Figure 15:
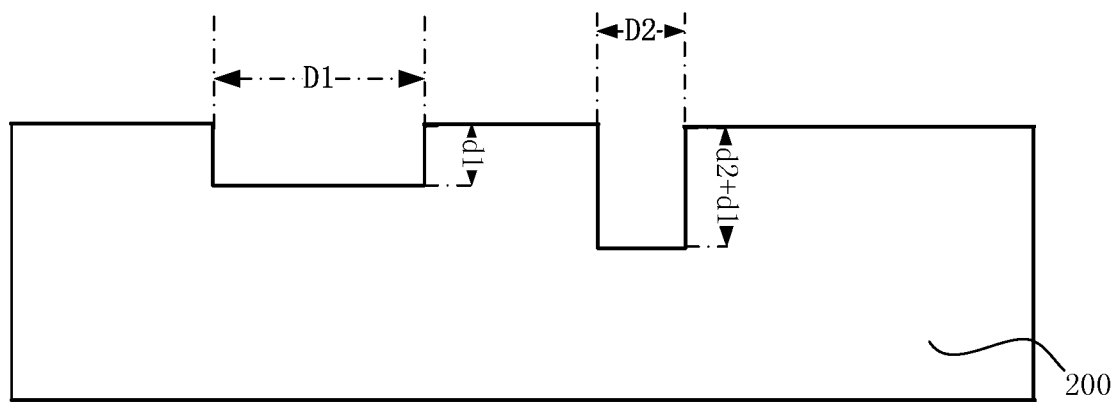

After that, the silicon oxide layer 201 is removed to form a structure as shown in FIG. 15, wherein the second silicon trench with a depth of d1 is at the first etching window D1, and the first silicon trench with a depth of d2+d1 is at the second etching window D2.

In the first embodiment described above, silicon trenches with three different depths or aspect ratios are formed by using the silicon oxide layer, the aluminum layer and the photoresist layer as mask layers; in the second embodiment, silicon trenches with two different depths or aspect ratios are formed by using the silicon oxide layer and the photoresist layer as mask layers. Similarly, in other specific embodiments, silicon trenches with four or more different depths or aspect ratios can be formed by using a plurality of the first mask layers and the second mask layers alternating with each other, i.e., the first mask layer and the second mask layer alternate with each other and repeat for several times, wherein the first mask layers are silicon oxide layers and the second mask layers are aluminum layers or silicon nitride layers. For example, silicon trenches with four different depths are formed by using a mask layer structure of silicon oxide layer—aluminum layer or silicon nitride layer—silicon oxide layer—aluminum layer or silicon nitride layer, or silicon trenches with five different depths are formed by using a mask layer structure of silicon oxide layer—aluminum layer or silicon nitride layer—silicon oxide layer—aluminum layer or silicon nitride layer—silicon oxide layer.

Furthermore, it should be noted that the specific materials of each mask layer in the above embodiments are non-limiting examples, as long as the selective etching ratio of the MEMS sealing cap silicon substrate to the mask layer is greater than or equal to 10:1 (preferably, between 10:1 to 100:1) during the process of etching the MEMS sealing cap silicon substrate. The mask layer may be selected from a silicon oxide layer, an aluminum layer, a photoresist layer, a silicon nitride layer and so on, but not limited to this.

The present invention also provides an etching mask structure of multiple silicon trenches for MEMS sealing cap wafer. The specific structures thereof can be understood by referring to FIGS. 5 and 12 and their corresponding descriptions, and detailed descriptions thereof are omitted here.

Although the preferred embodiments of the present invention are disclosed above, it is not intended to limit the present invention. Any possible changes and modifications can be made by any person skilled in the art, without departing from the spirit and scope of the present invention. Therefore, the scope of protection of the present invention should be based on the scope as defined in the claims of the invention.

What is claimed is:

1. A multiple silicon trenches forming method for MEMS sealing cap wafer, the method comprising:
   step S11, providing a MEMS sealing cap silicon substrate;
   step S12, forming n stacked mask layers on the MEMS sealing cap silicon substrate, and after forming each mask layer, photolithographing and etching the mask layer and all other mask layers beneath the same to form an etching window, wherein n is a positive integer greater than or equal to 3, for each positive integer i from 1 to n−1, the $i^{th}$ etching window is formed by sidewalls of the $i^{th}$ mask layer, the $(i-1)^{th}$ mask layer and through to sidewalls of the first mask layer to reach a portion of the MEMS sealing cap silicon substrate, the whole $i^{th}$ etching window is filled by $(i+1)^{th}$ mask layer to cover the portion of the MEMS sealing cap silicon substrate and further covered by the $(i+2)^{th}$ mask layer through to $n^{th}$ mask layer, each etching window in each mask layer is not overlapped with any other etching window in any other mask layer, the $i^{th}$ etching window is used to etch an $i^{th}$ silicon trench in the MEMS sealing cap silicon substrate, wherein for each positive integer i from 1 to n, the depth of the $i^{th}$ silicon trench is smaller than the depth of $(i+1)^{th}$ silicon trench, and any two adjacent mask layers are made of different materials;
   step S13, etching the MEMS sealing cap silicon substrate by using a current uppermost mask layer in the n mask layers as a mask, with an etching selectivity ratio of the MEMS sealing cap silicon substrate to the current uppermost mask layer greater than or equal to 10:1;
   step S14, removing the current uppermost mask layer;
   step S15, repeating the step S13 and the step S14 until all the n mask layers are removed.

2. The multiple silicon trenches forming method for MEMS sealing cap wafer of claim 1, wherein in the step S13, the etching selectivity ratio of the MEMS sealing cap silicon substrate to the current uppermost mask layer is between 10:1 to 100:1.

3. The multiple silicon trenches forming method for MEMS sealing cap wafer of claim 1, wherein the aspect ratios of the silicon trenches formed by etching are greater than 2 and the depths of the silicon trenches are greater than 3 µm.

4. The multiple silicon trenches forming method for MEMS sealing cap wafer of claim 1, wherein the number of the mask layers is 3, and the step S12 comprises:
   forming a first mask layer on the MEMS sealing cap silicon substrate;
   photolithographing and etching the first mask layer to form a first etching window in the first mask layer;
   forming a second mask layer on the first mask layer;
   photolithographing and etching the second mask layer and the first mask layer to form a second etching window in the second mask layer and the first mask layer;
   forming a third mask layer on the second mask layer;
   photoetching and etching the third mask layer, the second mask layer and the first mask layer to form a third etching window in the third mask layer, the second mask layer and the first mask layer.

5. The multiple silicon trenches forming method for MEMS sealing cap wafer of claim 4, wherein the step S13 to the step S15 comprise:
   etching the MEMS sealing cap silicon substrate by using the third mask layer, the second mask layer and the first mask layer as a mask to form a first silicon trench with a depth of d3 in the MEMS sealing cap silicon substrate;
   removing the third mask layer;
   etching the MEMS sealing cap silicon substrate by using the second mask layer and the first mask layer as a mask to form a second silicon trench with a depth of d2 in the MEMS sealing cap silicon substrate, while the depth of the first silicon trench being deepened to d3+d2;
   removing the second mask layer;
   etching the MEMS sealing cap silicon substrate by using the first mask layer as a mask to form a third silicon trench with a depth of d1 in the MEMS sealing cap silicon substrate, while the depth of the first silicon trench being deepened to d3+d2+d1, and the depth of the second silicon trench being deepened to d2+d1;
   removing the first mask layer.

6. The multiple silicon trenches forming method for MEMS sealing cap wafer of claim 5, wherein d3 is 10 µm~100 µm, d2 is 10 µm~80 µm, and d1 is 10 µm~60 µm.

7. The multiple silicon trenches forming method for MEMS sealing cap wafer of claim 4, wherein the first mask layer is a silicon oxide layer, the second mask layer is an aluminum layer or a silicon nitride layer, and the third layer is a photoresist mask layer.

8. The multiple silicon trenches forming method for MEMS sealing cap wafer of claim 1, wherein the number of the mask layers is 2, and the step S12 comprises:
   forming a first mask layer on the MEMS sealing cap silicon substrate;
   photolithographing and etching the first mask layer to form a first etching window in the first mask layer;
   forming a second mask layer on the first mask layer;
   photolithographing and etching the second mask layer and the first mask layer to form a second etching window in the second mask layer and the first mask layer.

9. The multiple silicon trenches forming method for MEMS sealing cap wafer of claim 8, wherein the step S13 to the step S15 comprise:
   etching the MEMS sealing cap silicon substrate by using the second mask layer and the first mask layer as a mask to form a first silicon trench with a depth of d2 in the MEMS sealing cap silicon substrate;
   removing the second mask layer;
   etching the MEMS sealing cap silicon substrate by using the first mask layer as a mask to form a second silicon trench with a depth of d1 in the MEMS sealing cap silicon substrate, while the depth of the first silicon trench being deepened to d2+d1;
   removing the first mask layer.

10. The multiple silicon trenches forming method for MEMS cap wafer of claim 9, wherein d2 is 10 μm~100 μm, and d1 is 10 μm~80 μm.

11. The multiple silicon trenches forming method for MEMS sealing cap wafer of claim 8, wherein the first mask layer is a silicon oxide layer, and the second mask layer is a photoresist layer.

12. The multiple silicon trenches forming method MEMS sealing cap wafer of claim 1, wherein n is greater than or equal to 4, and the n mask layers comprises a plurality of first mask layers and second mask layers alternating with each other, wherein the first mask layers are silicon oxide layers, and the second mask layers are aluminum layers or silicon nitride layers.

13. The multiple silicon trenches forming method for MEMS sealing cap wafer of claim 5, wherein the first mask layer is a silicon oxide layer, the second mask layer is an aluminum layer or a silicon nitride layer, and the third layer is a photoresist mask layer.

14. The multiple silicon trenches forming method for MEMS sealing cap wafer of claim 6, wherein the first mask layer is a silicon oxide layer, the second mask layer is an aluminum layer or a silicon nitride layer, and the third layer is a photoresist mask layer.

15. A multiple silicon trenches forming method for MEMS sealing cap wafer, characterized in comprising:
   providing a MEMS sealing cap silicon substrate;
   forming a silicon oxide layer on the MEMS sealing cap silicon substrate as a first mask layer;
   photolithographing and etching the first mask layer to form a first etching window in the first mask layer;
   forming an aluminum layer or a silicon nitride layer on the first mask layer as a second mask layer;
   photolithographing and etching the second mask layer and the first mask layer to form a second etching window in the second mask layer and the first mask layer;
   forming a photoresist layer on the second mask layer as a third mask layer;
   photolithographing and etching the third mask layer, the second mask layer and the first mask layer to form a third etching window in the third mask layer, the second mask layer and the first mask layer;
   etching the MEMS sealing cap silicon substrate by using the third mask layer, the second mask layer and the first mask layer as a mask to form a first silicon trench with a depth of d3 in the MEMS sealing cap silicon substrate;
   removing the third mask layer;
   etching the MEMS sealing cap silicon substrate by using the second mask layer and the first mask layer as a mask to form a second silicon trench with a depth of d2 in the MEMS sealing cap silicon substrate, while the depth of the first silicon trench being deepened to d3+d2;
   removing the second mask layer;
   etching the MEMS sealing cap silicon substrate by using the first mask layer as a mask to form a third silicon trench with a depth of d1 in the MEMS sealing cap silicon substrate, while the depth of the first silicon trench being deepened to d3+d2+d1 and the depth of the second silicon trench being deepened to d2+d1;
   removing the first mask layer.

* * * * *